(12) United States Patent
Jeng

(10) Patent No.: US 7,072,210 B2
(45) Date of Patent: Jul. 4, 2006

(54) MEMORY ARRAY

(75) Inventor: Erik S. Jeng, Taipei (TW)

(73) Assignee: Applied Intellectual Properties Co., Ltd., Taipei (TW)

( * ) Notice: Subject to any disclaimer, the term of this patent is extended or adjusted under 35 U.S.C. 154(b) by 0 days.

(21) Appl. No.: 10/831,199

(22) Filed: Apr. 26, 2004

(65) Prior Publication Data
US 2005/0237797 A1    Oct. 27, 2005

(51) Int. Cl.
*G11C 16/04*    (2006.01)
(52) U.S. Cl. .................... 365/185.01; 365/185.05; 365/185.26
(58) Field of Classification Search ........... 365/185.01, 365/185.26, 185.23, 207, 189.07, 185.29
See application file for complete search history.

(56) References Cited

U.S. PATENT DOCUMENTS

| | | | |
|---|---|---|---|
| 6,524,913 B1* | 2/2003 | Lin et al. ................. 438/261 |
| 6,545,915 B1* | 4/2003 | Ohtani et al. ........... 365/185.29 |
| 6,577,531 B1* | 6/2003 | Kato ...................... 365/185.01 |
| 6,788,601 B1* | 9/2004 | Takano et al. ............. 365/207 |
| 6,855,608 B1* | 2/2005 | Ramsbey et al. ........... 438/287 |
| 6,903,968 B1* | 6/2005 | Jeng ...................... 365/185.03 |
| 2004/0023440 A1* | 2/2004 | Ito et al. .................. 438/131 |
| 2004/0119112 A1* | 6/2004 | Lojek ..................... 257/316 |

FOREIGN PATENT DOCUMENTS

JP    406302830 A  *  4/1993

* cited by examiner

*Primary Examiner*—Tuan T. Nguyen
*Assistant Examiner*—Dang Nguyen
(74) *Attorney, Agent, or Firm*—Birch, Stewart, Kolasch & Birch, LLP

(57) ABSTRACT

A memory array including a plurality of word lines, a plurality of first source/drain lines, a plurality of second source/drain lines, and a plurality of memory units. Each memory unit includes a gate electrode coupled to one of the word lines, a first source/drain region coupled to one of the first source/drain lines or first bit lines, a second source/drain region coupled to one of the second source/drain lines or second bit lines, a first spacer between the first source/drain region and the gate electrode to store electrons or electric charges, and a second spacer between the second source/drain region and the gate electrode to store electrons or electric charges.

27 Claims, 17 Drawing Sheets

MEMORY ARRAY

BACKGROUND OF THE INVENTION

1. Field of the Invention

The present invention relates to a semiconductor device, and more specifically to a memory array with increased data throughput.

2. Description of the Related Art

Non-volatile read only memory (ROM) retains information even if power is cut off. Erasable ROM types comprise Mask ROM, EPROM, EEPROM, and Flash Memory, of which Mask ROM cannot modify stored data, and is suited to large fabrications. Additionally, Flash Memory, using electrons entering and exiting floating gate to store information, is non-volatile and accessible, and can also restore and access information even when power is not provided.

FIG. 1a is a cross section of a conventional flash memory unit during programming. When programming is performed, a high voltage is applied to a control gate electrode 105 and a drain region 101a, and then electrons penetrate through a gate oxide layer 102 to a floating gate electrode 103 from the drain region 101a in a silicon substrate 101.

FIG. 1b is a cross section of a conventional flash memory unit during erasure. When erasure is performed, a negative or zero voltage is applied to the control gate electrode 105, and a high voltage is applied to the drain region 101a in the silicon substrate 101. Electrons then penetrate through the gate oxide layer 102 back to the drain region 101a from the floating gate electrode 103.

As a result, one set of data can be programmed or erased each time by the conventional flash memory unit, that is, the maximum set count of data programmed or erased each time equals the number of memory units.

FIG. 1c is a cross section of a conventional programmed Mask ROM. The programming process is disclosed as follows. First, a silicon substrate 120 having a memory unit, such as a MOS transistor, thereon is provided. An oxide layer 122 is then formed over the silicon substrate 120. The memory unit comprises a gate electrode 123, such as a polysilicon layer, and source/drain regions 121a and 121b, such as $n^+$ or $p^+$ diffusion region, here, the source/drain regions 121a and 121b are $n^+$ diffusion regions.

Next, a lithography process is performed using a code mask to form a patterned photoresist layer over a part of the gate electrode 123 and the source/drain regions 121a and 121b. Channel implantation with the silicon substrate 120 having memory units is then performed to complete the memory unit coding.

When the gate electrode 123 is uncovered by the patterned photoresist, the memory unit is defined as logic "1" due to implantation of the channel region 124, to the contrary, when the gate electrode 123 is covered by the patterned photoresist, the memory unit is defined as logic "0", because the channel region 124 cannot be implanted.

Implantation Programming is completed by implanting ions into channel region to adjust the threshold voltage. This process is performed after forming the MOS transistor, and before forming contacts or inter layer dielectrics (ILD).

As integration density is increased, reduced time and memory unit size, and increased quantity and speed of data treatment are required for fabricating Mask ROMs.

SUMMARY OF THE INVENTION

Accordingly, an object of the present invention is to provide various multi-bit memory arrays to increase memory unit density, and thereby, throughput.

To achieve this and other objects, the present invention provides a memory array, comprising a plurality of word lines, a plurality of first source/drain lines, a plurality of second source/drain lines, and a plurality of memory units. Each memory unit comprises a gate electrode coupled to one of the word lines, a first source/drain region coupled to one of the first source/drain lines or first bit lines, a second source/drain region coupled to one of the second source/drain lines or second bit lines, a first spacer between the first source/drain region and the gate electrode to store electrons or electric charges, a second spacer between the second source/drain region and the gate electrode to store electrons or electric charges.

The present invention also provides another memory array, comprising a plurality of word lines, a plurality of first source/drain lines, a plurality of second source/drain lines, and a plurality of memory units. Each memory unit comprises a gate electrode coupled to one of the word lines, a first source/drain region coupled to one of the first source/drain lines or first bit lines, a second source/drain region coupled to one of the second source/drain lines or second bit lines, a programmed source/drain extended area between the gate electrode and the first or second source/drain region to store or keep electric information.

The present invention further provides another memory array, comprising a plurality of word lines, a plurality of first source/drain lines, a plurality of second source/drain lines, and a plurality of memory units. Each memory unit comprises a gate electrode coupled to one of the word lines, a first source/drain region coupled to one of the first source/drain lines or first bit lines, a second source/drain region coupled to one of the second source/drain lines or second bit lines, an anti-fuse between the gate electrode and the first or second source/drain region.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

A detailed description is given in the following embodiments with reference to the accompanying drawings.

BRIEF DESCRIPTION OF THE DRAWINGS

The present invention will become more fully understood from the detailed description given hereinafter and the accompanying drawings, which are given by way of illustration only, and thus are not limitative of the present invention, and in which.

DETAILED DESCRIPTION OF THE INVENTION

Figure 1A:
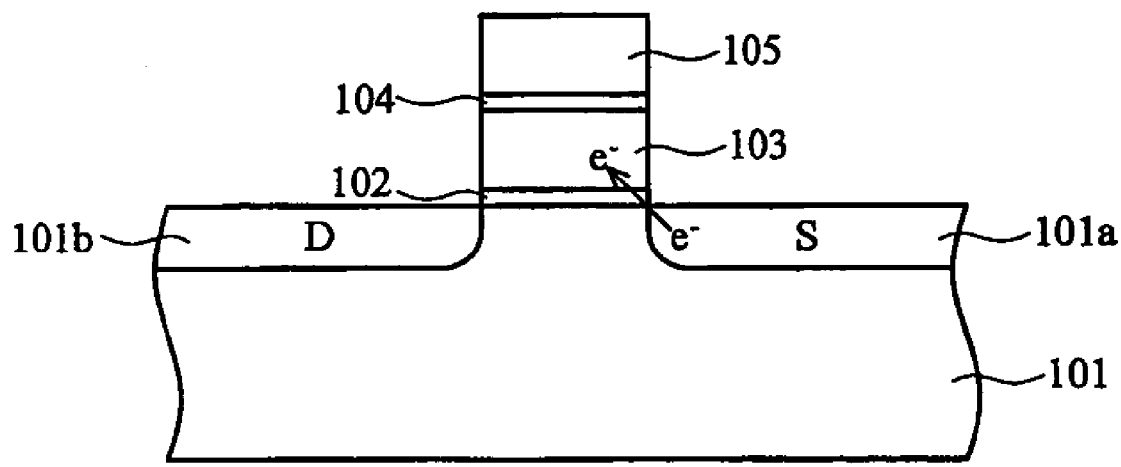
FIG. 1a is a cross section of a conventional flash memory unit during programming.
Figure 1B:
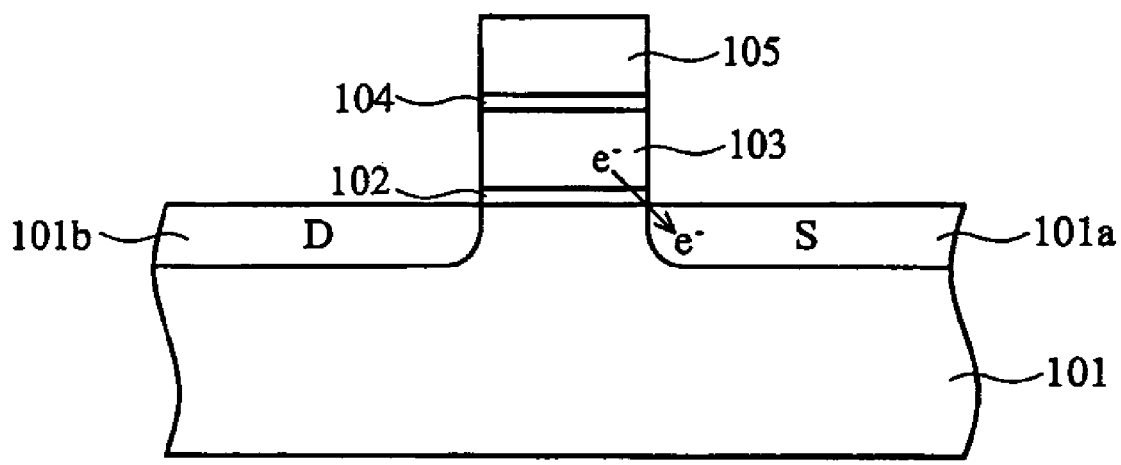
FIG. 1b is a cross section of a conventional flash memory unit during erasure.
Figure 1C:
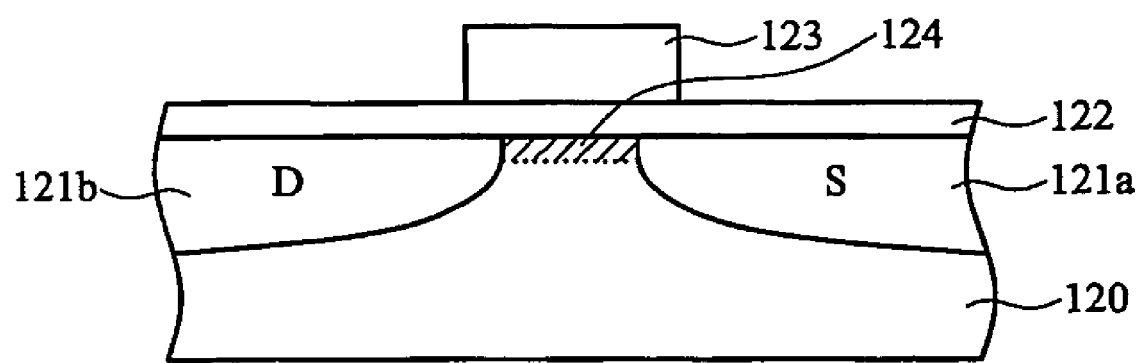
FIG. 1c is a cross section of a conventional programmed Mask ROM.
Figure 2A:
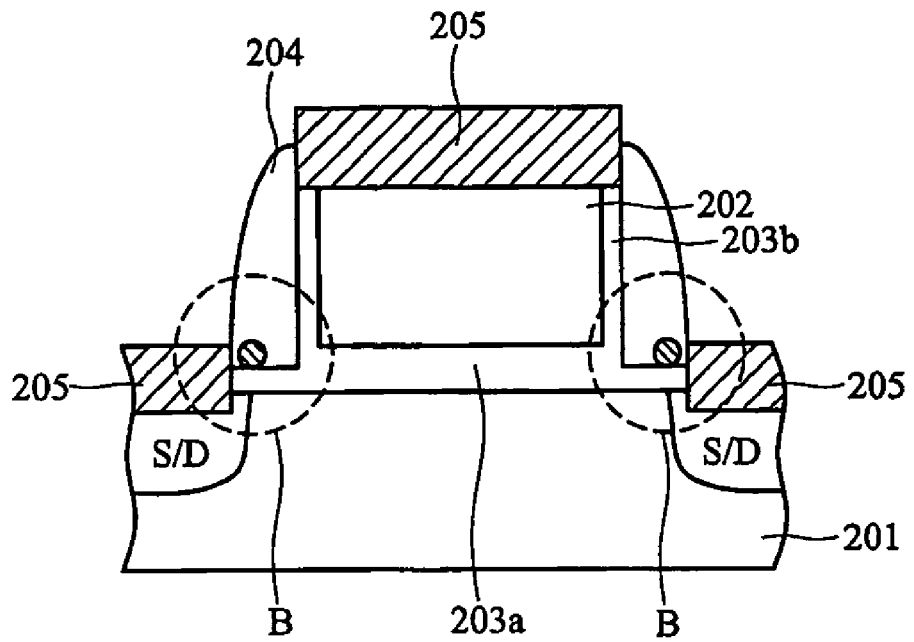
FIG. 2a is a cross section of a multi-bit EPROM unit of the present invention.

FIG. 2a is a cross section of the multi-bit EPROM unit of the present invention. The multi-bit memory unit comprises a semiconductor substrate 201 having a source/drain region therein, a gate electrode 202, such as a polysilicon layer, on the semiconductor substrate 201, a gate dielectric layer 203a, such as a gate oxide layer, between the gate electrode 202 and the semiconductor substrate 201, a spacer 204, such as a nitride layer, on a sidewall of the gate electrode 202 to store electrons or electric charges, an oxide layer 203b between the spacer 204 and the gate electrode 202, and a salicide layer 205, such as $TiSi_2$, $CoSi_2$ or NiSi, over the gate electrode 202 and the source/drain region. The memory unit further comprises a dielectric layer, such as an oxide layer, over the semiconductor substrate 201 and the above elements, and a contact plug filled with a conductive layer in the dielectric layer to connect the source/drain region installed between gate electrodes and a subsequently formed bit line.

Figure 2B:
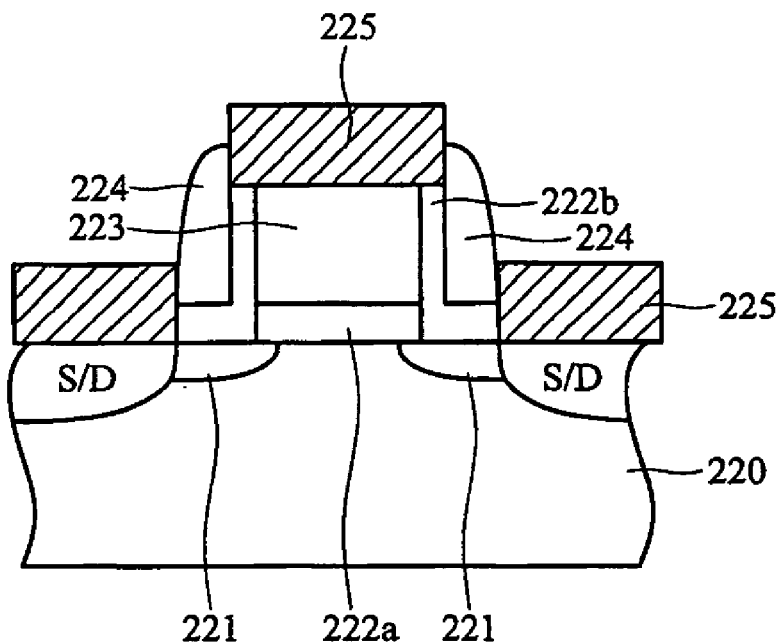
FIG. 2b is a cross section of a Mask ROM unit of the present invention.

FIG. 2b is a cross section of the multi-bit Mask ROM of the present invention. The multi-bit memory unit comprises a semiconductor substrate 220 having a gate dielectric layer 222a and a gate electrode 223 thereon and a source/drain extension area 221 therein under one side of the gate electrode 223, a spacer 224 on a sidewall of the gate electrode 223, an oxide layer 222b between the spacer 224 and the gate electrode 223, a source/drain region in the semiconductor substrate 220, and a salicide layer 225 over the gate electrode 223 and the source/drain region, wherein the source/drain extension area 221 is formed using a photoresist layer and the gate electrode 223 as masks formed by a code mask, and the source/drain region is formed by implanting the semiconductor substrate 220 with As or P ions using the gate electrode 223 and the spacer 224 as masks.

If the source/drain extension area 221 is not formed between the source/drain region and the gate electrode 223, the threshold voltage of the memory unit may increase. When accessing data, if a normal voltage is applied to the gate electrode 223, the source/drain region can not be conducted, producing merely lowered leakage current, thus the logic "0" is accessed. If the source/drain extension area 221 is formed between the source/drain region and the gate electrode 223, the threshold voltage of the memory unit may decrease. When accessing data, if a normal voltage is applied to the gate electrode 223, the source/drain region can be conducted, and logic "1" is accessed. Thus, the memory unit is accessed as logic "1", when the source/drain extension 221 is formed coupled to the gate electrode 223, and the memory unit is accessed as logic "0", when the source/drain extension 221 is not coupled to the gate electrode 223.

Figure 2C:
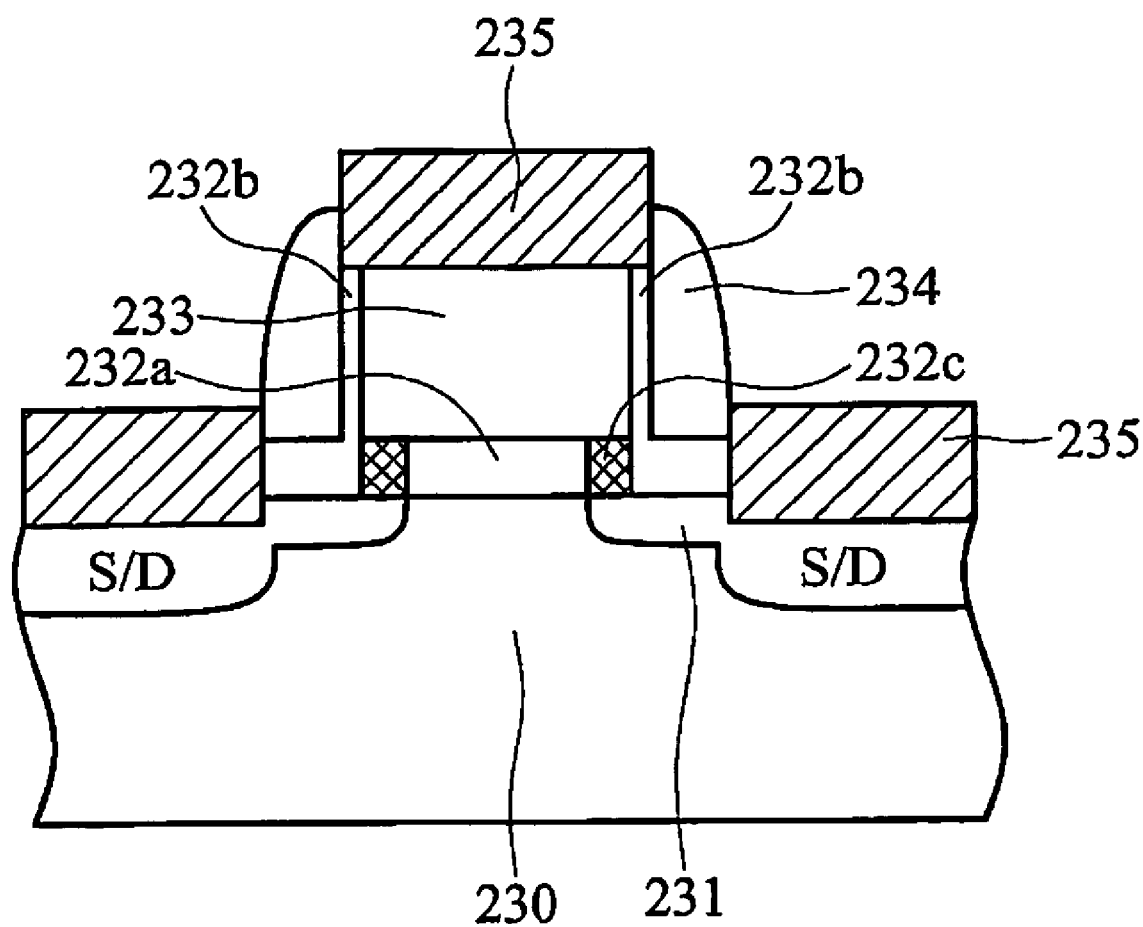
FIG. 2c is a cross section of a One Time Programmable anti-fuse ROM unit of the present invention.

FIG. 2c is a cross section of the One Time Programmable anti-fuse ROM of the present invention. The memory unit comprises a semiconductor substrate 230 having a gate dielectric layer 232a and a gate electrode 233 thereon and a source/drain extension area 231 therein under one side of the gate electrode 233, a spacer 224 on a sidewall of the gate electrode 233, an insulation layer 232b between the spacer 234 and the gate electrode 233, a source/drain region in the semiconductor substrate 230, and a salicide layer 235 over the gate electrode 233 and the source/drain region, wherein the source/drain extension area 231 is formed using the gate electrode 233 as a mask, and the source/drain region is formed by implanting the semiconductor substrate 230 using the gate electrode 233 and the spacer 234 as masks. After thermal process, the source/drain extension area 231 diffuses toward under the gate electrode 233, resulting in isolation between the gate electrode 233 and the source/drain extension area 231 by the gate dielectric layer 232c. The gate dielectric layer 232c can be broken down to create leakage by selectively applying high voltage, used as anti-fuse memory.

If the anti-fuse between the source/drain region and the gate electrode 233 is not breakdown, the electric leakage of the memory unit may decrease. When accessing data, if a normal voltage is applied to the gate electrode 233, the source/drain region can not be conducted, producing merely lowered leakage current, thus the logic "0" is accessed. If the anti-fuse between the source/drain region and the gate electrode 233 is breakdown, the electric leakage of the memory unit may increase. When accessing data, if a normal voltage is applied to the gate electrode 233, high leakage current may occur, whereby the logic "1", is accessed. Thus, the memory unit is accessed as logic "1" when the anti-fuse is-breakdown, and logic "0" when the anti-fuse is not breakdown.

FIRST EMBODIMENT

Figure 3A:
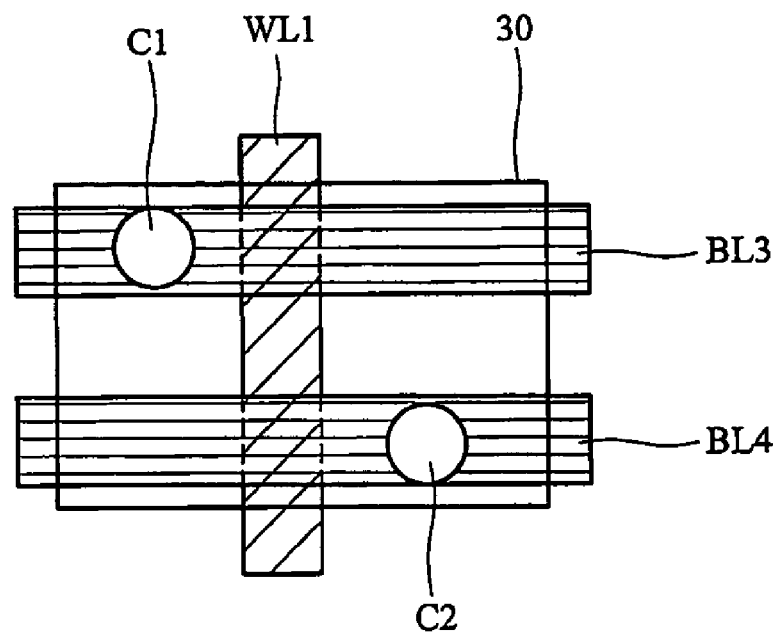
FIG. 3a shows a single multi-bit memory unit in the first embodiment of the present invention.
Figure 3B:
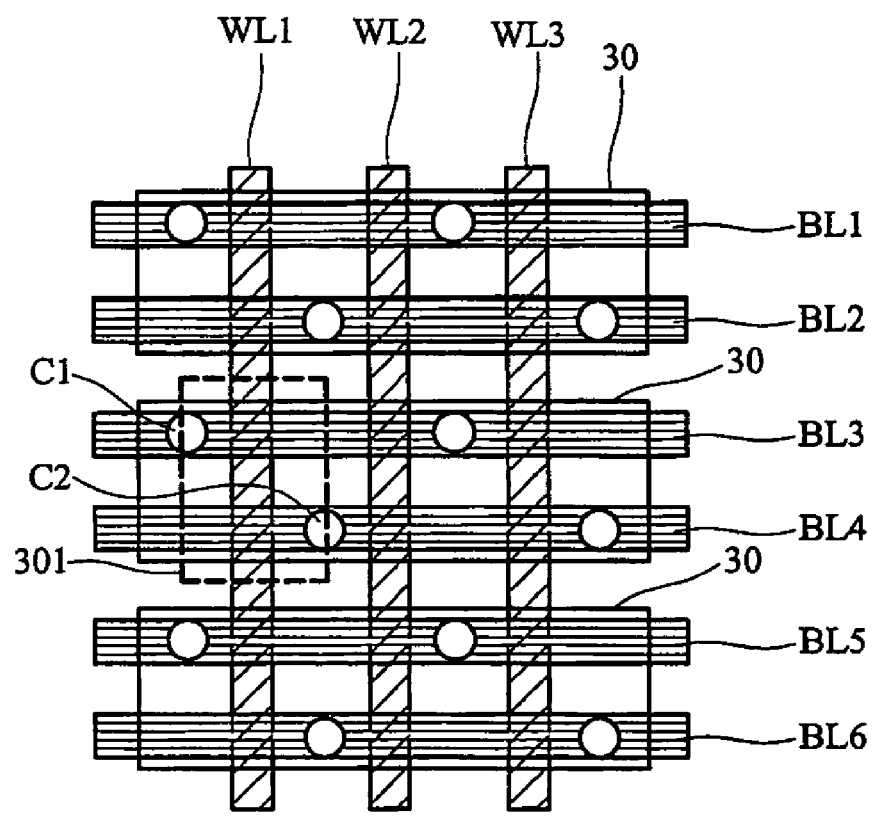
FIG. 3b shows a multi-bit memory array in the first embodiment of the present invention.
Figure 3C:
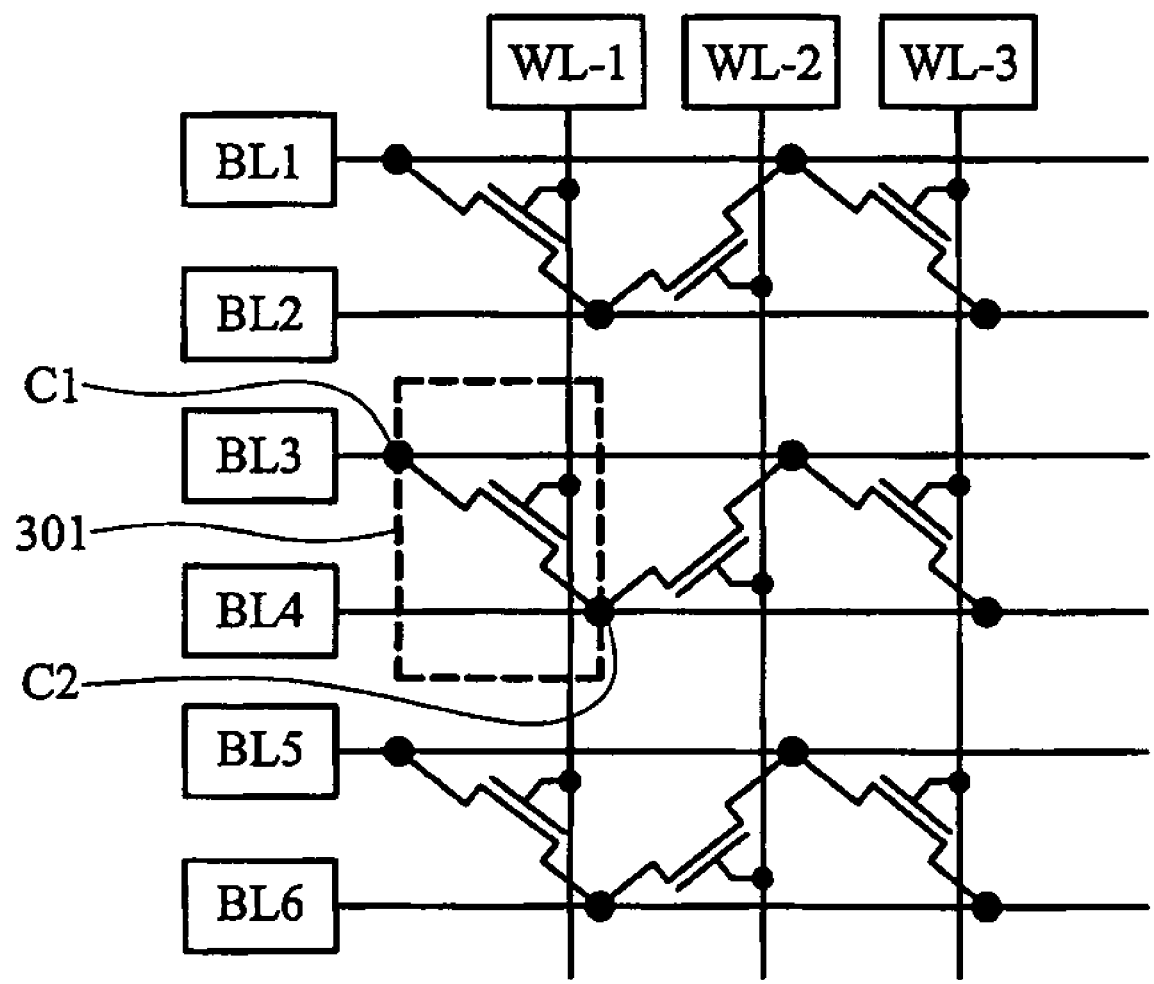
FIG. 3c shows an equivalent circuit of the multi-bit memory array in FIG. 3b.

FIG. 3a shows a single multi-bit memory unit in the first embodiment of the present invention, FIG. 3b shows a memory array in the first embodiment of the present invention, and FIG. 3c shows an equivalent circuit of the memory array in FIG. 3b.

Referring to FIG. 3a, a semiconductor substrate (not shown) having the multi-bit memory unit shown in FIG. 2a or 2b is provided, with an active area 30 defined therein.

The multi-bit memory unit comprises a word line $WL^1$, a first bit line $BL^3$, a second bit line $BL^4$, a first connection point $C^1$, and a second connection point $C^2$, wherein the word line is the gate electrode, and the connection points are contact plugs.

The word line $WL^1$ is perpendicular to the first bit line $BL^3$ and the second bit line $BL^4$. The first bit line $BL^3$ is parallel to the second bit line $BL^4$, and the first bit line $BL^3$ and the second bit line $BL^4$ are separated into two portions by the word line $WL^1$. The first connection point $C^1$ electrically connects to the first bit line $BL^3$, and the second connection point $C^2$ electrically connects to the second bit line $BL^4$, wherein the first connection point $C^1$ and the second connection point $C^2$ are located on different sides separated by the word line $WL^1$. The active area 30 comprises the above elements. The active area 30 is rectangular, and the first connection point $C^1$ and the second connection point $C^2$ are respectively located on the diagonal position thereof.

Referring to FIG. 3b, the memory array comprises word lines $WL^1$, $WL^2$, and $WL^3$, bit lines $BL^1$, $BL^2$, $BL^3$, $BL^4$, $BL^5$, and $BL^6$, connection points $C^1$ and $C^2$, memory unit 301, and active areas 30, wherein the memory unit 301 is the single multi-bit memory unit shown in FIG. 3a. Each connection point can be jointly used by adjacent memory units, for example, the second connection point $C^2$ is jointly used by the memory unit 301 and its adjacent memory unit to form the electrical connection, as shown in FIG. 3c.

SECOND EMBODIMENT

Figure 4A:
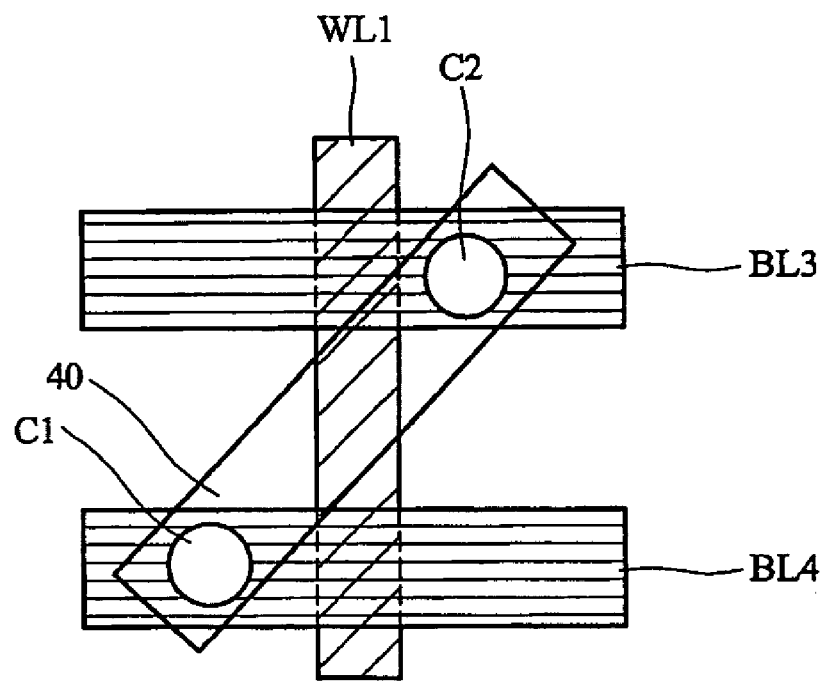
FIG. 4a shows a single multi-bit memory unit in the second embodiment of the present invention.
Figure 4B:
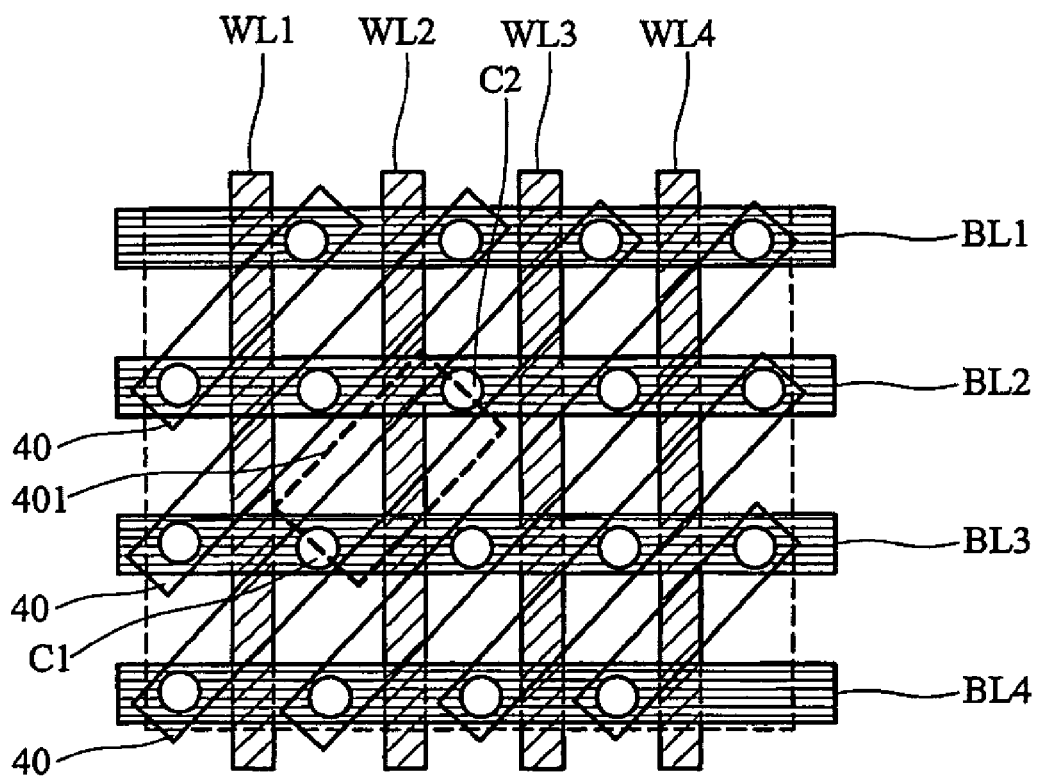
FIG. 4b shows a multi-bit memory array in the second embodiment of the present invention.
Figure 4C:
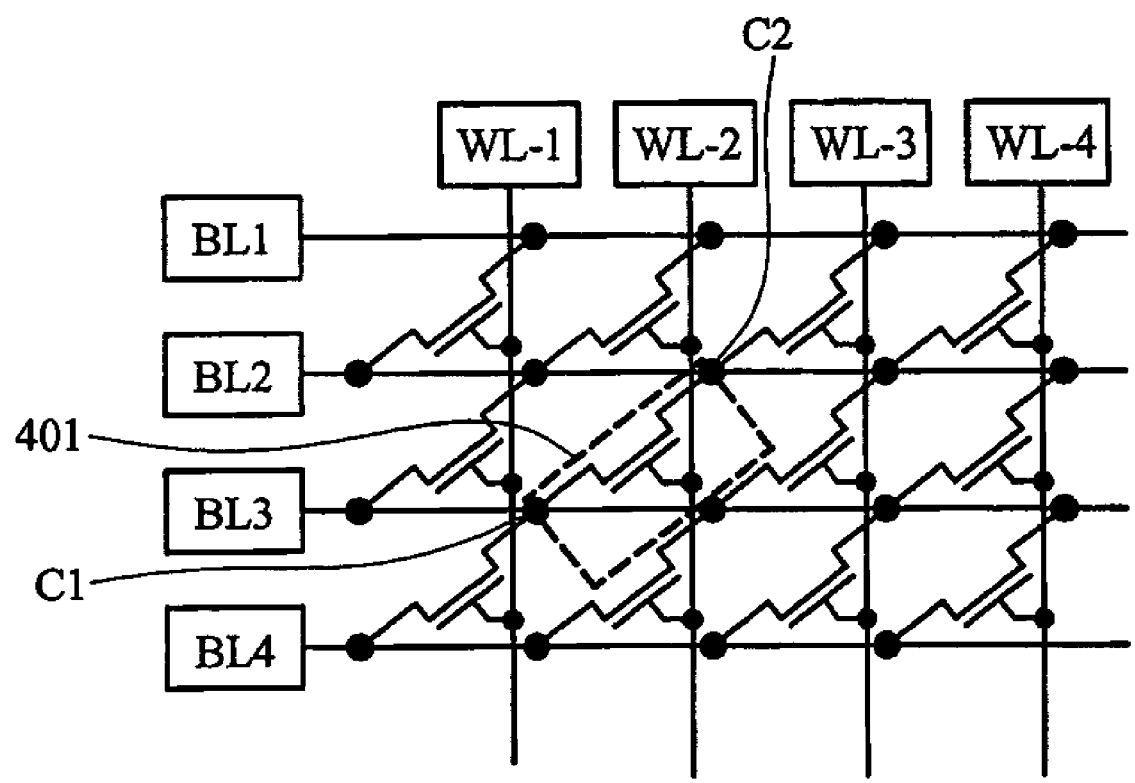
FIG. 4c shows an equivalent circuit of the multi-bit memory array in FIG. 4b.

FIG. 4a shows a single multi-bit memory unit in the second embodiment of the present invention, FIG. 4b shows a memory array in the second embodiment of the present invention, and FIG. 4c shows an equivalent circuit of the memory array in FIG. 4b.

Referring to FIG. 4a, a semiconductor substrate (not shown) having the multi-bit memory unit shown in FIG. 2a or 2b is provided, with an active area 40 defined therein.

The multi-bit memory unit comprises a word line $WL^1$, a first bit line $BL^3$, a second bit line $BL^4$, a first connection point $C^1$, and a second connection point $C^2$, wherein the word line is the gate electrode, and the connection points are contact plugs.

The word line $WL^1$ is perpendicular to the first bit line $BL^3$ and the second bit line $BL^4$. The first bit line $BL^3$ is parallel to the second bit line $BL^4$, and the first bit line $BL^3$ and the second bit line $BL^4$ are separated into two portions by the word line $WL^1$. The first connection point $C^1$ electrically connects to the first bit line $BL^3$, and the second connection point $C^2$ electrically connects to the second bit line $BL^4$, wherein the first connection point $C^1$ and the second connection point $C^2$ are located on different sides separated by the word line $WL^1$. The active area 40 comprises the above elements. The active area 40 is rectangular, and the first connection point $C^1$ and the second connection point $C^2$ are respectively located on two ends of the active area 40. The included angle between the active area 40 and the word line $WL^1$ is less than 90°.

Referring to FIG. 4b, the memory array comprises word lines $WL^1$, $WL^2$, $WL^3$, and $WL^4$, bit lines $BL^1$, $BL^2$, $BL^3$, and $BL^4$, connection points $C^1$ and $C^2$, memory unit 401, and active areas 40, wherein the memory unit 401 is the single multi-bit memory unit shown in FIG. 4a. Each connection point can be jointly used by adjacent memory units, for example, the second connection point $C^2$ is jointly used by the memory unit 401 and its adjacent memory unit to form the electrical connection, as shown in FIG. 4c.

THIRD EMBODIMENT

Figure 5A:
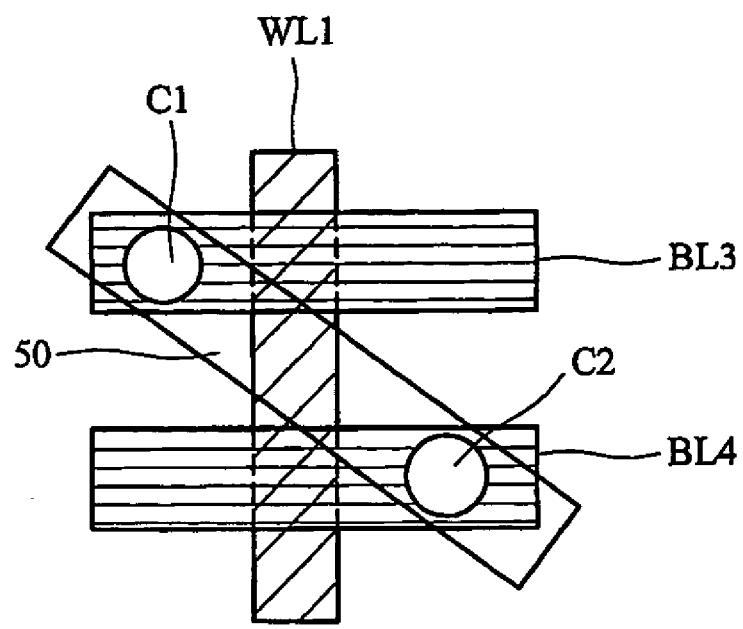
FIGS. 5a and 5b show two single multi-bit memory units in the third embodiment of the present invention.
Figure 5B:
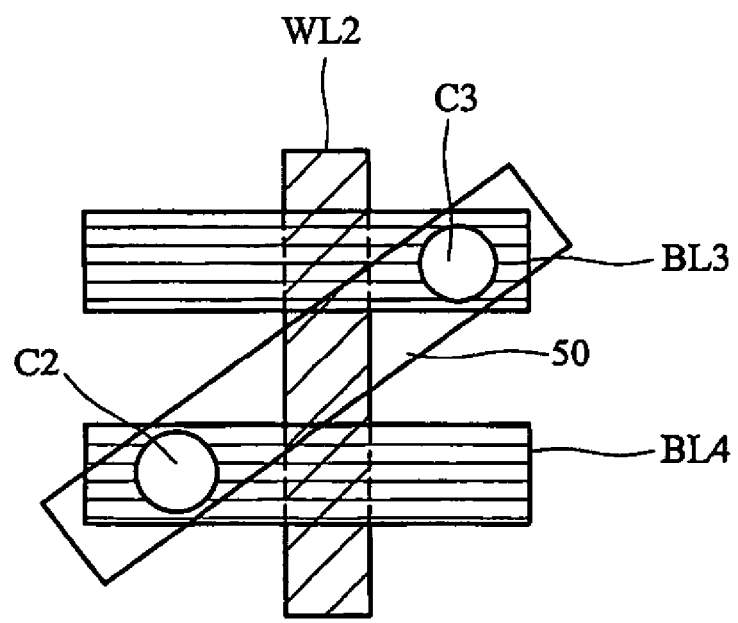
Figure 5C:
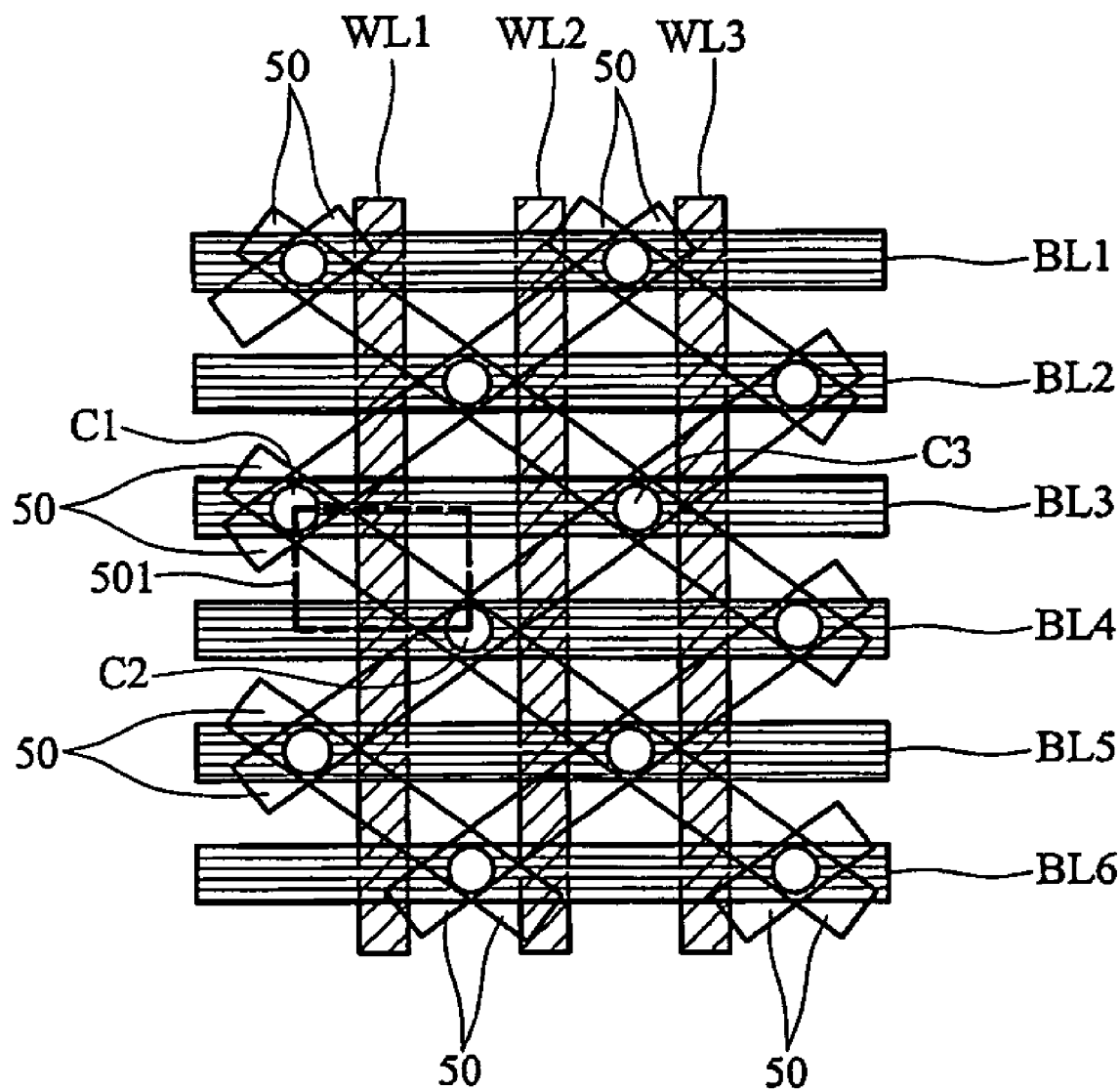
FIG. 5c shows a multi-bit memory array in the third embodiment of the present invention.
Figure 5D:
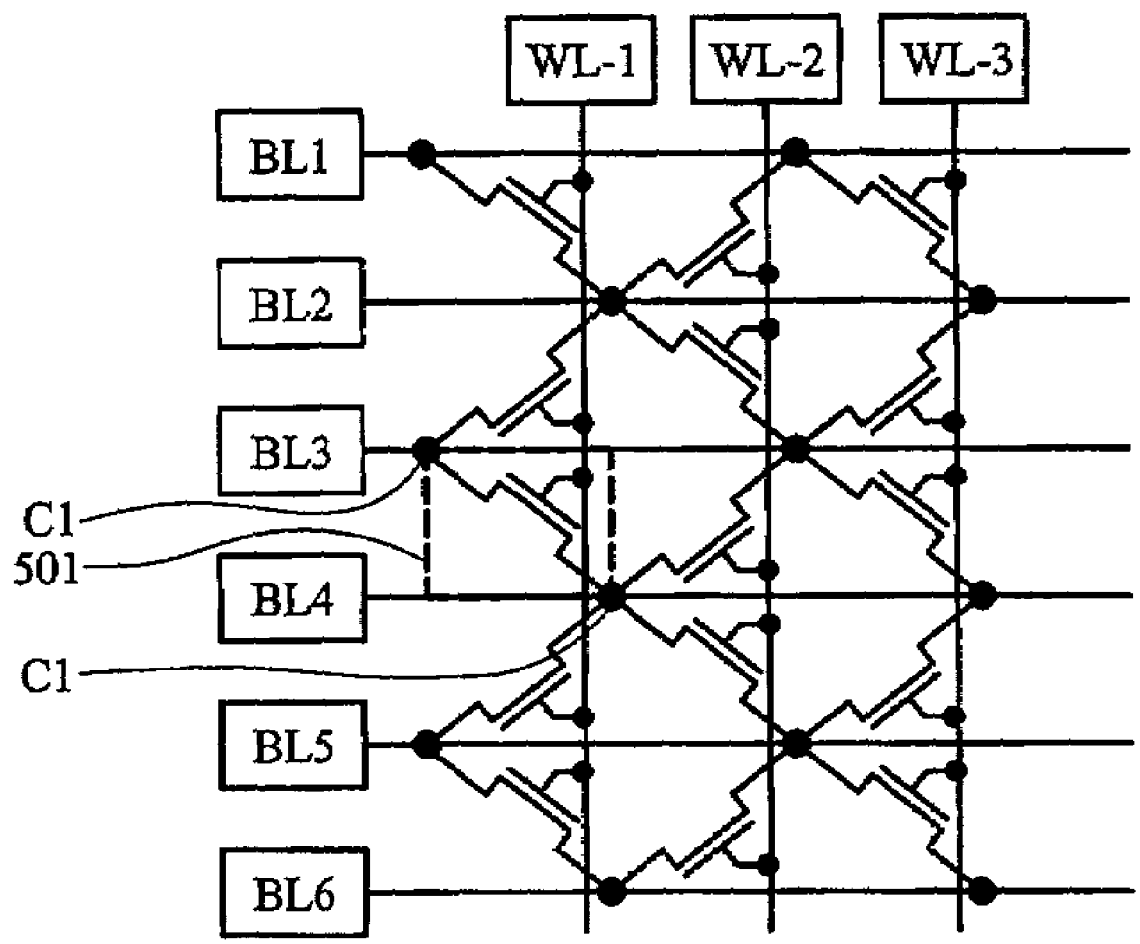
FIG. 5d shows an equivalent circuit of the multi-bit memory array in FIG. 5c.

FIGS. 5a and 5b show two single multi-bit memory units in the third embodiment of the present invention, FIG. 5c shows a memory array in the third embodiment of the present invention, and FIG. 5d shows an equivalent circuit of the memory array in FIG. 5c.

Referring to FIGS. 5a and 5b, a semiconductor substrate (not shown) having a multi-bit memory unit shown in FIG. 2a or 2b is provided, with an active area 50 defined therein.

Referring to FIG. 5a, one of the two multi-bit memory units is disclosed as follows. The multi-bit memory unit comprises a word line $WL^1$, a first bit line $BL^3$, a second bit line $BL^4$, a first connection point $C^1$, and a second connection point $C^2$, wherein the word line is the gate electrode, and the connection points are contact plugs.

The word line $WL^1$ is perpendicular to the first bit line $BL^3$ and the second bit line $BL^4$. The first bit line $BL^3$ is parallel to the second bit line $BL^4$, and the first bit line $BL^3$ and the second bit line $BL^4$ are separated into two portions by the word line $WL^1$. The first connection point $C^1$ electrically connects to the first bit line $BL^3$, and the second connection point $C^2$ electrically connects to the second bit line $BL^4$, wherein the first connection point $C^1$ and the second connection point $C^2$ are located on different sides separated by the word line $WL^1$. The active area 50 comprises the above elements. The active area 50 is rectangular, and the first connection point $C^1$ and the second connection point $C^2$ are respectively located on two ends of the active area 50. The included angle between the active area 50 and the word line $WL^1$ is less than 90°.

Referring to FIG. 5b, another multi-bit memory unit is disclosed as follows. The multi-bit memory unit comprises a word line $WL^2$, a first bit line $BL^3$, a second bit line $BL^4$, a second connection point $C^2$, and a third connection point $C^3$, wherein the word line is the gate electrode, and the connection points are contact plugs.

The word line $WL^2$ is perpendicular to the first bit line $BL^3$ and the second bit line $BL^4$. The first bit line $BL^3$ is parallel to the second bit line $BL^4$, and the first bit line $BL^3$ and the second bit line $BL^4$ are segregated to two portions by the word line $WL^2$. The second connection point $C^2$ electrically connects to the first bit line $BL^3$, and the third connection point $C^3$ electrically connects to the second bit line $BL^4$, wherein the second connection point $C^2$ and the third connection point $C^3$ are located on different sides separated by the word line $WL^2$. The active area 50 comprises the above elements. The active area 50 is rectangular, and the second connection point $C^2$ and the third connection point $C^3$ are respectively located on two ends of the active area 50. The included angle between the active area 50 and the word line $WL^2$ is less than 90°.

Referring to FIG. 4c, the memory array comprises word lines $WL^1$, $WL^2$, and $WL^3$, bit lines $BL^1$, $BL^2$, $BL^3$, $BL^4$, $BL^5$, and $BL^6$, connection points $C^1$, $C^2$, and $C^3$, memory unit 501, and active areas 50, wherein the memory unit 501 is the single multi-bit memory unit shown in FIG. 5a or 5b. Each connection point can be jointly used by four adjacent memory units, for example, the second connection point $C^2$ is jointly used by the memory unit 501 and its adjacent three memory units to form the electrical connection, as shown in FIG. 5c.

FOURTH EMBODIMENT

Figure 6A:
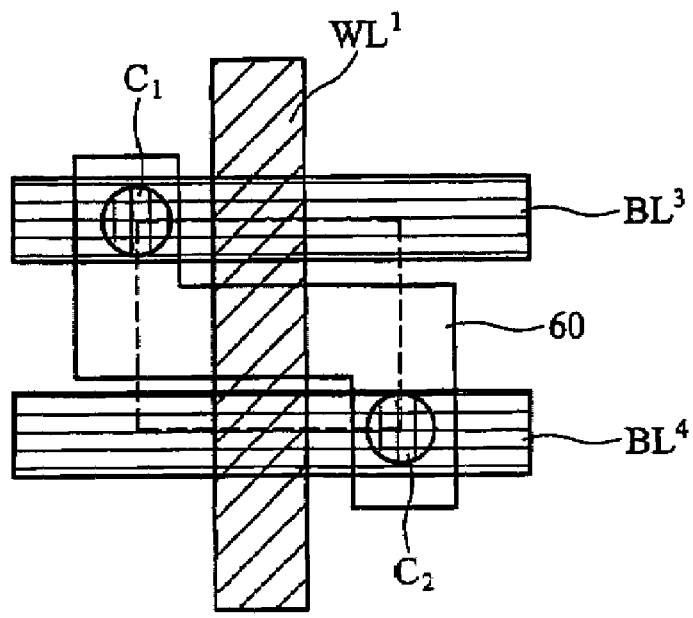
FIGS. 6a and 6b show two single multi-bit memory units in the fourth embodiment of the present invention.
Figure 6B:
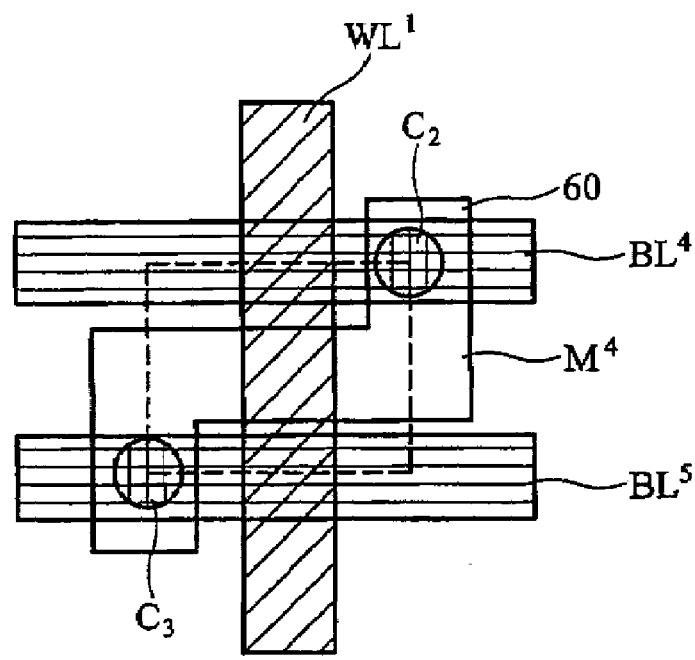
Figure 6C:
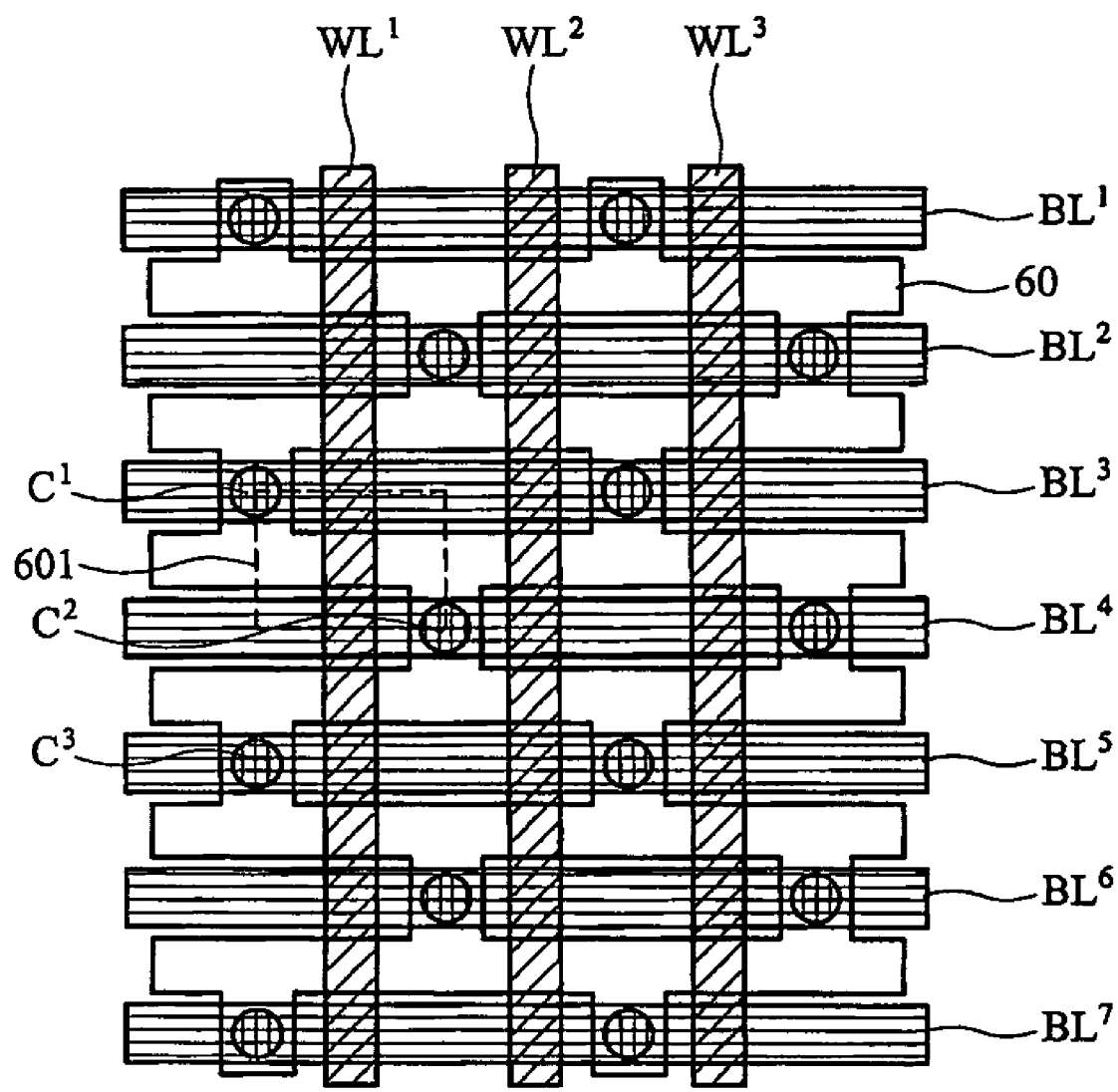
FIG. 6c shows a multi-bit memory array in the fourth embodiment of the present invention.
Figure 6D:
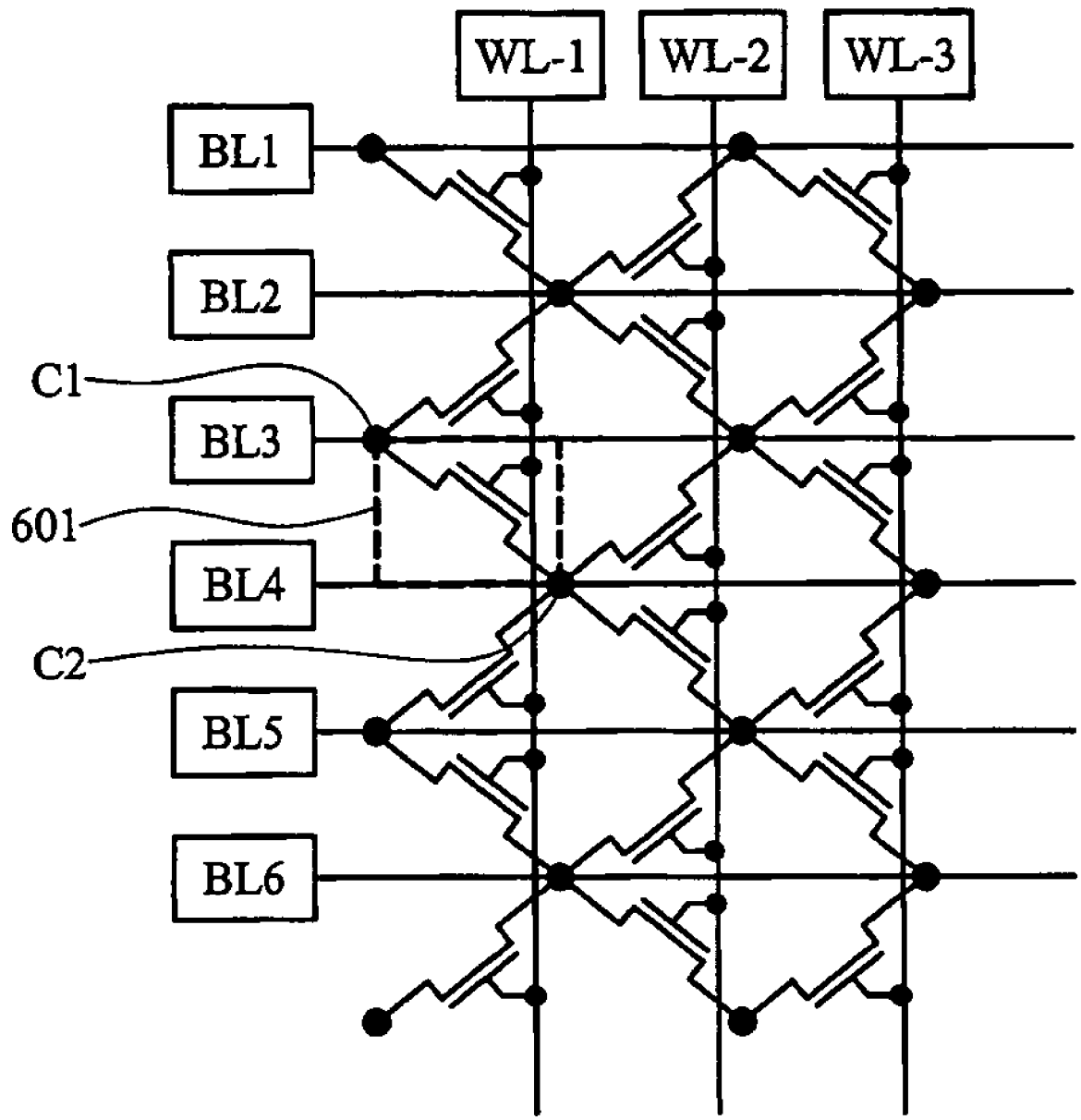
FIG. 6d shows an equivalent circuit of the multi-bit memory array in FIG. 6c.

FIGS. 6a and 6b show two single multi-bit memory units in the fourth embodiment of the present invention, FIG. 6c shows a memory array in the fourth embodiment of the present invention, and FIG. 6d shows an equivalent circuit of the memory array in FIG. 6c.

Referring to FIGS. 6a and 6b, a semiconductor substrate (not shown) having a multi-bit memory unit shown in FIG. 2a or 2b is provided, with an active area 60 defined therein.

Referring to FIG. 6a, one of the two multi-bit memory units is disclosed as follows. The multi-bit memory unit comprises a word line $WL^1$, a first bit line $BL^3$, a second bit line $BL^4$, a first connection point $C^1$, and a second connection point $C^2$, wherein the word line is the gate electrode, and the connection points are contact plugs.

The word line $WL^1$ is perpendicular to the first bit line $BL^3$ and the second bit line $BL^4$. The first bit line $BL^3$ is parallel to the second bit line $BL^4$, and the first bit line $BL^3$ and the second bit line $BL^4$ are separated into two portions by the word line $WL^1$. The first connection point $C^1$ electrically connects to the first bit line $BL^3$, and the second connection point $C^2$ electrically connects to the second bit line $BL^4$, wherein the first connection point $C^1$ and the second connection point $C^2$ are located on different sides separated by the word line $WL^1$. The active area 60 comprises the above elements. The active area 60 is Z-shaped, comprising a main area and two extended areas, with the two extended areas perpendicularly connecting to two ends of the main area respectively. A first source/drain region is formed in one of the extended areas and a part of the main area, and a second source/drain region is formed in another extended area and a part of the main area. Therefore, the first connection point $C^1$ corresponding to the first source/drain region and the second connection point $C^2$ corresponding to the second source/drain region are respectively located on the terminal of the extended areas.

Referring to FIG. 6b, another multi-bit memory unit is disclosed as follows. The multi-bit memory unit comprises a word line $WL^2$, a second bit line $BL^4$, a third bit line $BL^5$, a second connection point $C^2$, and a third connection point $C^3$, wherein the word line is the gate electrode, and the connection points are contact plugs.

The word line $WL^2$ is perpendicular to the second bit line $BL^4$ and the third bit line $BL^5$. The second bit line $BL^4$ is parallel to the third bit line $BL^5$, and the second bit line $BL^4$ and the third bit line $BL^5$ are separated to two portions by the word line $WL^2$. The second connection point $C^2$ electrically connects to the second bit line $BL^4$, and the third connection point $C^3$ electrically connects to the third bit line $BL^5$, wherein the second connection point $C^2$ and the third connection point $C^3$ are located on different sides separated by the word line $WL^2$. The active area 60 comprises the above elements. The active area 60 is Z-shaped, comprising a main area and two extended areas, with the two extended areas perpendicularly connecting to two ends of the main area respectively. The second connection point $C^2$ and the third connection point $C^3$ are respectively located at the terminus of the extended areas.

Referring to FIG. 6c, the memory array comprises word lines $WL^1$, $WL^2$, and $WL^3$, bit lines $BL^1$, $BL^2$, $BL^3$, $BL^4$, $BL^5$, $BL^6$, and $BL^7$, connection points $C^1$, $C^2$, and $C^3$, memory unit 601, and active areas 60, wherein the memory unit 601 is the single multi-bit memory unit shown in FIG. 6a or 6b. Each connection point can be jointly used by four adjacent memory units, for example, the second connection point $C^2$ is jointly used by the memory unit 601 and its adjacent three memory units to form the electrical connection, as shown in FIG. 6c.

FIFTH EMBODIMENT

Figure 7A:
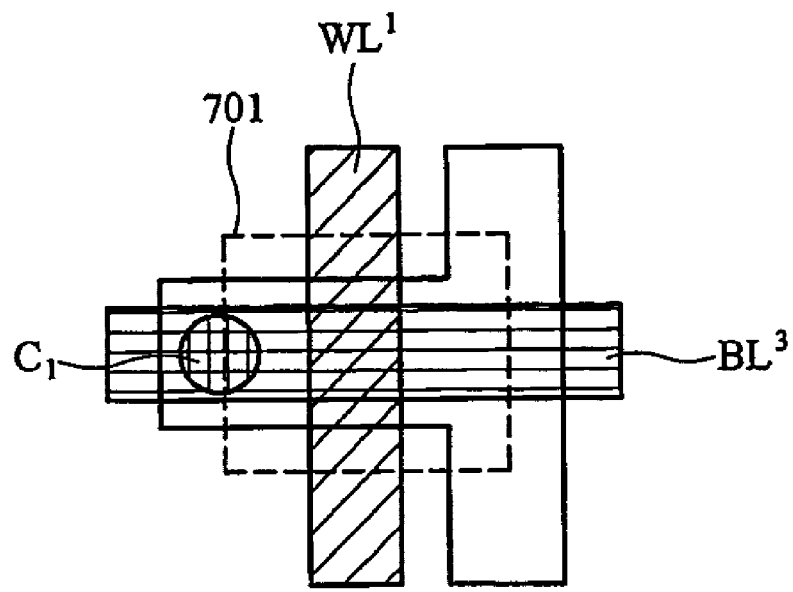
FIGS. 7a and 7b show two single multi-bit memory units in the fifth embodiment of the present invention.
Figure 7B:
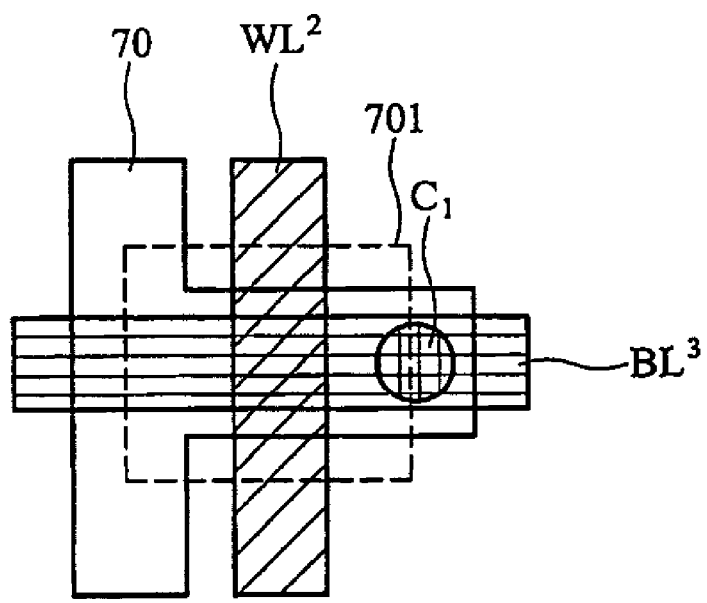
Figure 7C:
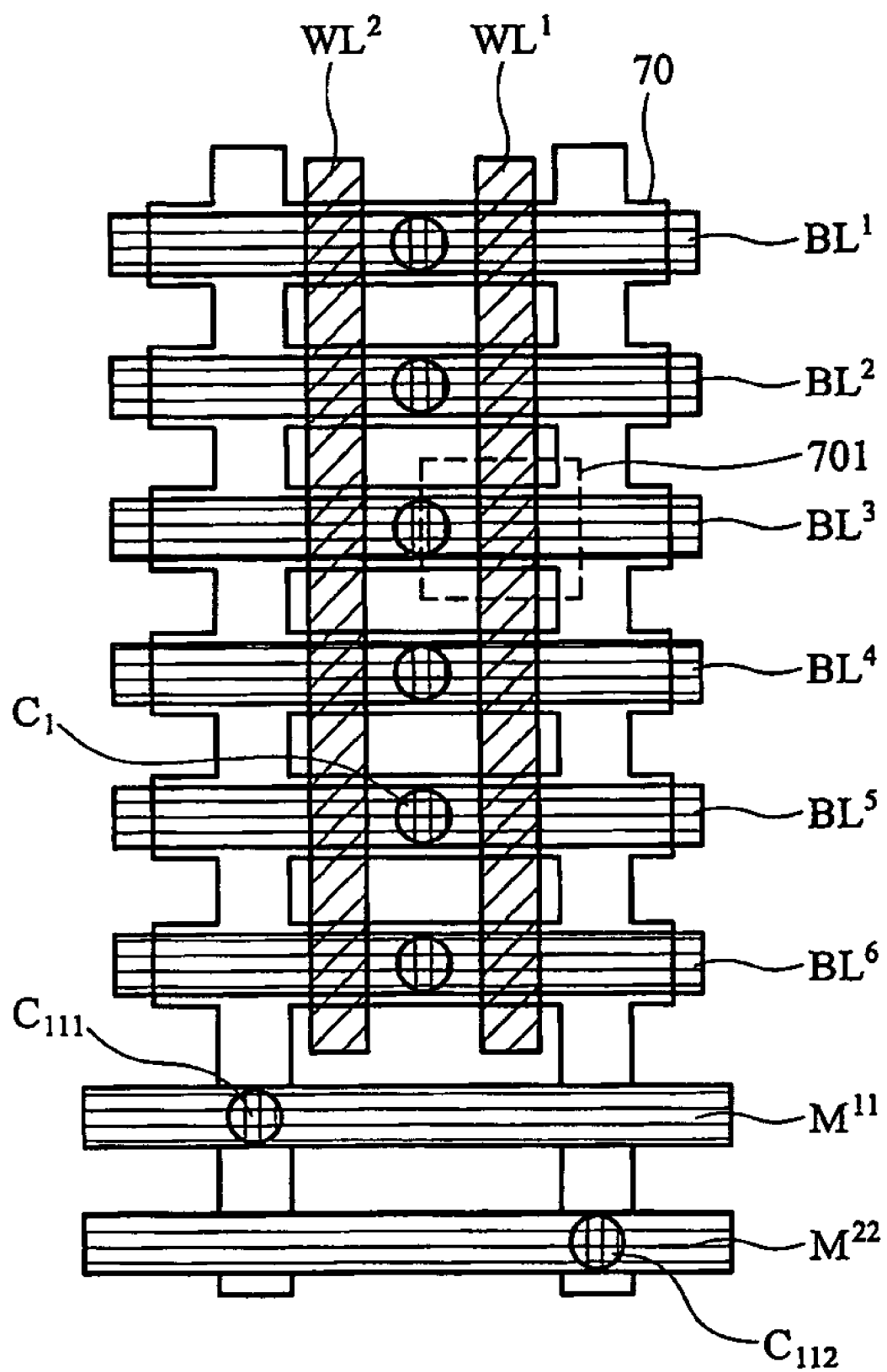
FIG. 7c shows a multi-bit memory array in the fifth embodiment of the present invention.
Figure 7D:
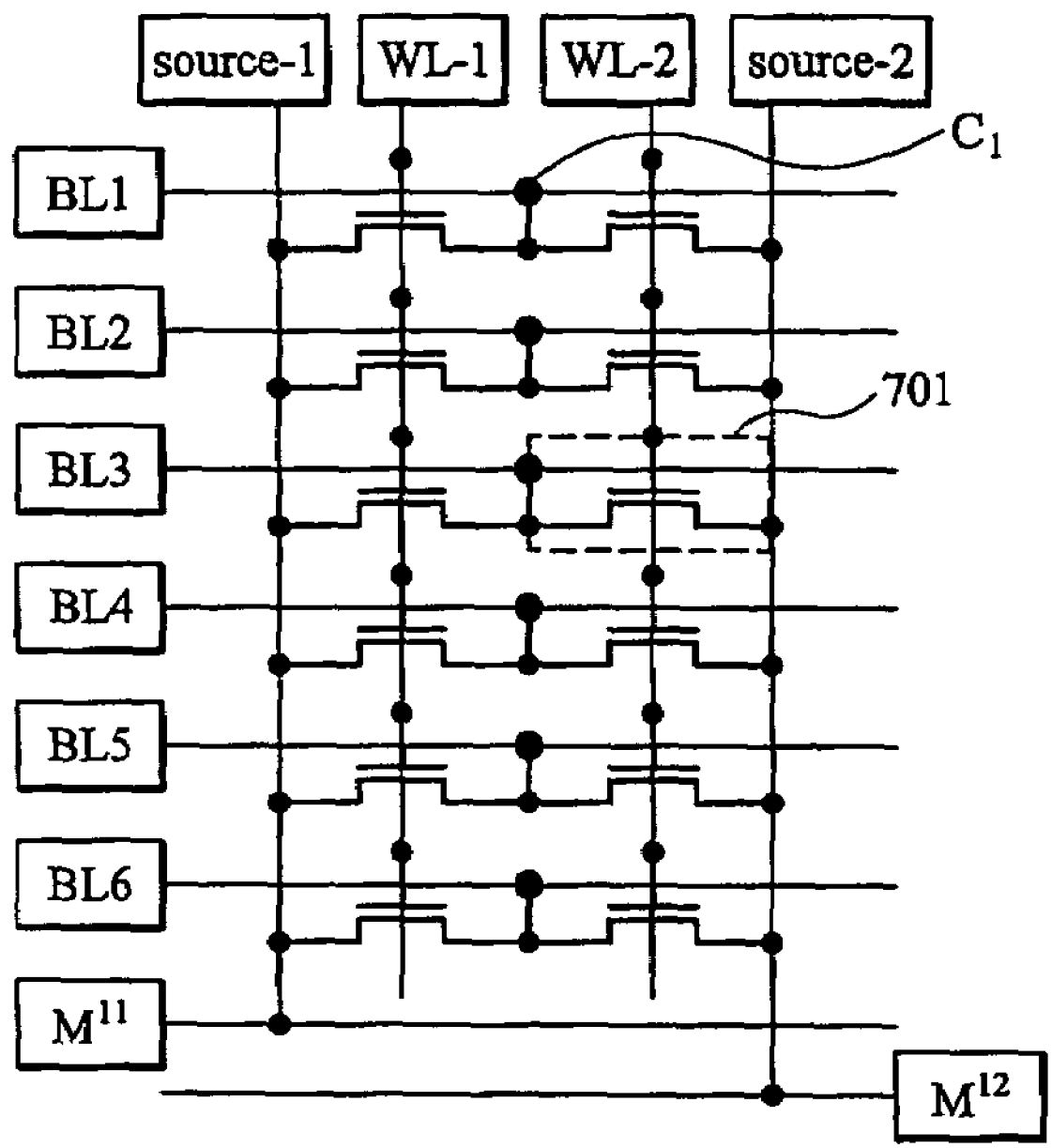
FIG. 7d shows an equivalent circuit of the multi-bit memory array in FIG. 7c.

FIGS. 7a and 7b show two single multi-bit memory units in the fifth embodiment of the present invention, FIG. 7c shows a memory array in the fifth embodiment of the present invention, and FIG. 7d shows an equivalent circuit of the memory array in FIG. 7c.

Referring to FIGS. 7a and 7b, a semiconductor substrate (not shown) having a multi-bit memory unit shown in FIG. 2a or 2b is provided, with an active area 70 defined therein.

Referring to FIG. 7a, the two multi-bit memory units are disclosed as follows. The multi-bit memory unit comprises a word line $WL^1$ or $WL^2$, a first bit line $BL^3$, a first connection point $C^1$, wherein the word line is the gate electrode, and the connection point is contact plug.

The word line $WL^1$ or $WL^2$ is perpendicular to the first bit line $BL^3$, thus the first bit line $BL^3$ is separated to two portions thereby. The first connection point $C^1$ is located on one of the separated sides by the word line $WL^1$ or $WL^2$, and electrically connects to the first bit line $BL^3$. The active area 70 comprises the above elements. The active area 70 is T-shaped, comprising a main area and an extended area, with one end of the main area connecting to the middle of the extended area. The main area is parallel to the first bit line $BL^3$ (the first source line) corresponding thereto. The extended area is parallel to the word line corresponding thereto.

Referring to FIG. 7c, the memory array comprises word lines $WL^1$ and $WL^2$, bit lines $BL^1$, $BL^2$, $BL^3$, $BL^4$, $BL^5$, and $BL^6$, connection points $C^1$, $C^{111}$, and $C^{112}$, memory unit 701, and active areas 70, wherein the memory unit 701 is the single multi-bit memory unit shown in FIG. 7a or 7b. Each connection point corresponding to the drain area can be jointly used by two adjacent memory units in the same row, and the source area installed on the same column can be jointly used by each memory unit in the same column. Additionally, memory units connect to the additional metal line $M^{11}$ or $M^{12}$ by the connection point $C^{111}$ or $C^{112}$. Referring to FIG. 7d, the first connection point $C^1$ is jointly used by the memory unit 701 and its adjacent memory unit in the same row to form the electrical connection, and the source area, such as source-1, installed on the same column can be jointly used by each memory unit in the same column. Additionally, memory units connect to the additional metal line $M^{11}$ or $M^{12}$ by the connection point $C^{111}$ or $C^{112}$.

The present invention provides two blocks in a memory unit to store data, that is, two sets of data can be programmed or erased, simultaneously. The maximum set count of data programmed or erased each time is twice the number of memory units.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory array, comprising:
   a plurality of word lines;
   a plurality of first source/drain lines;

a plurality of second source/drain lines; and a plurality of memory units, comprising:

a gate electrode, coupled to one of the word lines;

a gate dielectric layer laid below the gate electrode;

a first source/drain region, coupled to one of the first source/drain lines or first bit lines, further comprising a first multi-layer dielectric spacer formed between the first source/drain region and the gate electrode to store electrons or electric charges; and a second source/drain region, coupled to one of the second source/drain lines or second bit lines, further comprising a second multi-layer dielectric spacer formed between the second source/drain region and the gate electrode to store electrons or electric charges;

a metal-semiconductor compound layer formed over the gate electrode, first source/drain region and second source/drain region;

a semiconductor channel formed between said first source/drain region and second source/drain region.

2. The memory array as claimed in claim 1, wherein the memory units are readable, writeable, and erasable.

3. The memory array as claimed in claim 1, wherein the word lines are gate electrode lines of the gate electrodes.

4. The memory array as claimed in claim 1, wherein the first source/drain region of each memory unit couples to the corresponding first source/drain line or the first bit line by a contact plug.

5. The memory array as claimed in claim 1, wherein the second source/drain region of each memory unit couples to the corresponding second source/drain line or the second bit line by a contact plug.

6. The memory array as claimed in claim 1, wherein an active area of each memory unit comprises the first source/drain region, the second source/drain region, and a channel between the first and second source/drain regions, and the active area is perpendicular to the word line.

7. The memory array as claimed in claim 1, wherein an active area of each memory unit comprises the first source/drain region, the second source/drain region, and a channel between the first and second source/drain regions, and an included angle between the active area and the word line is less than 90°.

8. The memory array as claimed in claim 1, wherein an active area of each memory unit comprises the first source/drain region, the second source/drain region, and a channel between the first and second source/drain regions, and the active area is Z-shaped, comprising a main area and two extended areas, with the two extended areas perpendicularly connecting to two ends of the main area respectively, and the first source/drain region is in one of the extended areas and a part of the main area, and the second source/drain region is in another extended area and a part of the main area.

9. The memory array as claimed in claim 1, wherein an active area of each memory unit comprises the first source/drain region, the second source/drain region, and a channel between the first and second source/drain regions, and the active area is T-shaped, comprising a main area and an extended area, wherein the end of the main area connects to the middle of the extended area, and the active area is parallel to the first source/drain line or the first bit line corresponding thereto, and the extended area is parallel to the word line corresponding thereto, and the first source/drain region is in a part of the main area, and the second source/drain region is in the extended area and a part of the main area.

10. A memory array, comprising:

a plurality of word lines;

a plurality of first source/drain lines;

a plurality of second source/drain lines; and a plurality of memory units, comprising:

a gate electrode, coupled to one of the word lines;

a gate dielectric layer laid below the gate electrode;

a first source/drain region, coupled to one of the first source/drain lines or first bit lines; and a second source/drain region, coupled to one of the second source/drain lines or second bit lines, further comprising a programmable source/drain extended doped area formed between the gate electrode and the first or second source/drain region for storing or keeping electric information;

a metal-semiconductor compound layer formed over the gate electrode, first source/drain region and second source/drain region;

a semiconductor channel formed between said first source/drain region and second source/drain region.

11. The memory array as claimed in claim 10, wherein the memory units are Mask ROM.

12. The memory array as claimed in claim 10, wherein the word lines are gate electrode lines of the gate electrodes.

13. The memory array as claimed in claim 10, wherein the first source/drain region of each memory unit couples to the corresponding first source/drain line or the first bit line by a contact plug.

14. The memory array as claimed in claim 10, wherein the second source/drain region of each memory unit couples to the corresponding second source/drain line or the second bit line by a contact plug.

15. The memory array as claimed in claim 10, wherein an active area of each memory unit comprises the first source/drain region, the second source/drain region, and a channel between the first and second source/drain regions, and the active area is perpendicular to the word line.

16. The memory array as claimed in claim 10, wherein an active area of each memory unit comprises the first source/drain region, the second source/drain region, and a channel between the first and second source/drain regions, and an included angle between the active area and the word line is less than 90°.

17. The memory array as claimed in claim 10, wherein an active area of each memory unit comprises the first source/drain region, the second source/drain region, and a channel between the first and second source/drain regions, and the active area is Z-shaped, comprising a main area and two extended areas, with the two extended areas perpendicularly connecting to two ends of the main area respectively, with the first source/drain region in one of the extended areas and a part of the main area, and the second source/drain region in another extended area and a part of the main area.

18. The memory array as claimed in claim 10, wherein an active area of each memory unit comprises the first source/drain region, the second source/drain region, and a channel between the first and second source/drain regions, and the active area is T-shaped, comprising a main area and an extended area, wherein the end of the main area connects to the middle of the extended area, and the active area is parallel to the first source/drain line or the first bit line corresponding thereto, and the extended area is parallel to the word line corresponding thereto, with the first source/drain region in a part of the main area, and the second source/drain region in the extended area and a part of the main area.

19. A memory array, comprising:
a plurality of word lines;
a plurality of first source/drain lines;
a plurality of second source/drain lines; and
a plurality of memory units, comprising:
a gate electrode, coupled to one of the word lines;
a dielectric spacer formed on the sidewalls of said gate electrode;
a gate dielectric layer laid below the gate electrode;
a first source/drain region, coupled to one of the first source/drain lines or first bit lines; and
a second source/drain region, coupled to one of the second source/drain lines or second bit lines, further comprising an anti-fuse dielectric formed between the gate electrode and the first or second source/drain region;
a metal-semiconductor compound layer formed over the gate electrode, first source/drain region and second source/drain region;
a semiconductor channel formed between said first source/drain region and second source/drain region.

20. The memory array as claimed in claim 19, wherein the memory units are One Time Programmable ROM.

21. The memory array as claimed in claim 19, wherein the word lines are gate electrode lines of the gate electrodes.

22. The memory array as claimed in claim 19, wherein the first source/drain region of each memory unit couples to the corresponding first source/drain line or the first bit line by a contact plug.

23. The memory array as claimed in claim 19, wherein the second source/drain region of each memory unit couples to the corresponding second source/drain line or the second bit line by a contact plug.

24. The memory array as claimed in claim 19, wherein an active area of each memory unit comprises the first source/drain region, the second source/drain region, and a channel between the first and second source/drain regions, and the active area is perpendicular to the word line.

25. The memory array as claimed in claim 19, wherein an active area of each memory unit comprises the first source/drain region, the second source/drain region, and a channel between the first and second source/drain regions, and an included angle between the active area and the word line is less than 90°.

26. The memory array as claimed in claim 19, wherein an active area of each memory unit comprises the first source/drain region, the second source/drain region, and a channel between the first and second source/drain regions, and an active area is Z-shaped, comprising a main area and two extended areas, with the two extended areas perpendicularly connecting to two ends of the main area respectively, with the first source/drain region in one of the extended areas and a part of the main area, and the second source/drain region in another extended area and a part of the main area.

27. The memory array as claimed in claim 19, wherein an active area of each memory unit comprises the first source/drain region, the second source/drain region, and a channel between the first and second source/drain regions, and the active area is T-shaped, comprising a main area and an extended area, with the end of the main area connecting to the middle of the extended area, and the active area is parallel to the first source/drain line or the first bit line corresponding thereto, and the extended area is parallel to the word line corresponding thereto, with the first source/drain region in a part of the main area, and the second source/drain region in the extended area and a part of the main area.

* * * * *